United States Patent [19]
Luoni et al.

[11] Patent Number: 5,883,537
[45] Date of Patent: *Mar. 16, 1999

[54] CIRCUIT AND METHOD FOR CONTROLLED INDEPENDENT RECYCLE OF DISCHARGE CURRENT OF MULTIPLE INDUCTIVE LOADS

[75] Inventors: Liana Luoni, Como; Fabio Marchio', Sedriano; Giorgio Rossi, Nerviano, all of Italy

[73] Assignee: SGS-Thomson Microelectronics S.r.l., Agrate Brianza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 688,490

[22] Filed: Jul. 30, 1996

[30] Foreign Application Priority Data

Jul. 31, 1995 [EP] European Pat. Off. ............. 95830344

[51] Int. Cl.$^6$ ...................................................... H03K 5/08
[52] U.S. Cl. .......................... 327/318; 327/110; 327/309; 323/284; 361/91
[58] Field of Search .......................... 327/108–112, 309, 327/318, 427, 434; 361/91; 323/282, 284, 289

[56] References Cited

U.S. PATENT DOCUMENTS

| | | | |
|---|---|---|---|
| 4,679,112 | 7/1987 | Craig | 361/33 |
| 5,396,117 | 3/1995 | Housen et al. | 327/434 |
| 5,416,361 | 5/1995 | John et al. | 327/110 |
| 5,523,714 | 6/1996 | Topp et al. | 327/309 |
| 5,570,057 | 10/1996 | Palara | 327/427 |
| 5,576,648 | 11/1996 | Rossi et al. | 327/434 |

FOREIGN PATENT DOCUMENTS

| | | |
|---|---|---|
| A-0 525 522 | 2/1993 | European Pat. Off. |
| A-0 622 717 | 11/1994 | European Pat. Off. |
| A-2 593 946 | 8/1987 | France. |
| A-2 654 880 | 5/1991 | France. |

*Primary Examiner*—Kenneth B. Wells
*Attorney, Agent, or Firm*—Wolf, Greenfield & Sacks, P.C.

[57] ABSTRACT

A circuit controllably and independently recycles the discharge current of a plurality of inductive loads that are connected between first and second power supply terminals. For each of the loads, an active element for driving the inductive load is provided, as well as a regulator for controlling the recycling of the discharge current from the respective load, which is connected to the control terminal of the active element and to a node for connection between the active element and the respective inductive load.

29 Claims, 3 Drawing Sheets

CIRCUIT AND METHOD FOR CONTROLLED INDEPENDENT RECYCLE OF DISCHARGE CURRENT OF MULTIPLE INDUCTIVE LOADS

BACKGROUND OF THE INVENTION

1. Field of the Invention

This invention relates to a circuit and method for controllably and independently recycling the discharge current of a plurality of inductive loads connected between first and second power supply terminals.

2. Discussion of the Related Art

Throughout the description to follow, the invention will be discussed, by way of non-limitative example, as applied to electronic systems specifically intended for automotive use which comprise devices having inductive loads connected in the manner mentioned above.

As is known, a number of electronic and electromagnetic devices, arranged to perform a variety of functions in motor cars, include one or more inductive loads. Such devices also distinguish themselves by the current that their respective loads are to withstand. Some inductive loads are of relatively small size and can only withstand moderately large currents during their operation. Devices of this kind may include relays of several different types, for example. On the other hand, there are inductive loads of larger size, such as those contained in fuel injection control devices, which can store larger amounts of energy.

In the systems referred to hereinafter, each inductive load usually has one terminal which is kept at a fixed voltage and another terminal connected to a preferably integrated control circuit driving the flow of current through the load.

Two configurations are known in the art wherein the fixed voltage terminal of the load is connected either to the power supply line or to ground. In the former case, the load is driven from its lowest voltage terminal, in a so-called low-side driver configuration, whereas in the latter case, the configuration is that known as high-side driver.

The control circuit comprises an active element, such as a driving transistor, which in most cases is a power transistor and performs switching functions to alternately force and interrupt the flow of current through the inductor. The active element is controlled by a drive signal generated within the circuit itself.

It is well recognized that the driving of markedly reactive loads, as inductive loads happen to be, generally causes some problems during the transients. In fact, upon cutting off the flow of current through an inductor, a voltage increase, i.e. an overvoltage, instantaneously appears across it which may be positive or negative depending upon the specific circuit design. This overvoltage is due to the energy previously stored in the inductor during the charging phase and generated by the flow of electric current forced through the inductor remaining constant even after the flow of current is cut off. Thus, an electromotive force is induced which tends to keep the current at the value attained during the "on" period, i.e. during the charging phase. Since the load has one terminal at a fixed potential, the increase in potential will occur at the other terminal, i.e. the terminal for connection to the control circuit.

For the device to operate as designed, the voltage peak should have limited width, for otherwise the peak could cause breakdowns in the junctions of the semiconductor elements present in the control circuit, or in other devices connected to this circuit. Where the circuit is integrated monolithically, the overvoltage may fire parasitic transistors, and ultimately cause the device to breakdown.

As is known to skilled persons in this art, to reduce the overvoltage a means may be provided for dissipating the energy stored up in the inductor, i.e. a means enabling a discharge current from the inductor to be recycled. The energy built up in the inductive load is dissipated by causing current to flow through pre-arranged elements, usually power ones.

In conventional approaches, the recycling circuit also functions to regulate the voltage increase. While the current is being recycled, the voltage on the inductive load reaches a maximum value which is set by the recycling means itself. This voltage limiting effect is called "clamping" in the pertinent literature. The value of the clamped voltage at that maximum remains constant through a given time interval, to then decrease in absolute value, simultaneously with the current, down to a zero value which corresponds to a fully discharged inductive load.

The duration of the discharging phase, i.e. the so-called discharge time, is tied directly to the maximum voltage value reached on the inductor.

The discharge time is of particular consequence. It is frequently important that the discharge time be controlled accurately. For example, with devices for automotive use, it is on the basis of this time that logic control circuits operatively connected to the devices are correspondingly set. In addition, if the device is a fuel injector which is controlled to open and close by the presence or absence of a current flow through the load, it is important that the control current flowing through the load can be cut off within a short time, so that the closing time of the injector can be made short and a precise amount of fuel injected.

The discharging phase is regulated by suitably sizing the recycling circuit to correspondingly select the maximum voltage value.

It is convenient if this regulation can be performed substantially independent of changes in outside conditions, such as ambient or fabrication temperature, or process spread in the instance of integrated circuits.

In accordance with the prior art, a well-known class of circuit designs, to which this invention is related, have been provided to recycle the current through the same transistor which is to drive the inductive load and already arranged to accept the discharge current peak through it, this usually being a power element. A recycling regulating circuit is connected between the load terminal arranged to be connected to the control circuit, that is to the driving transistor, and a control terminal of the transistor. That circuit will control the value of the voltage present on the load and automatically turn on the transistor when this voltage reaches a predetermined maximum value. In the field of automotive devices, this voltage maximum value is commonly on the order of a few tens volts, a typical value for a fuel injector being 70 volts, for example.

Those circuit elements which define the maximum voltage value represent, within the recycling regulating circuit, what throughout the following description will be referred to as the "reference for the voltage".

A variety of conventional designs exist in this field.

A first solution provides one or more Zener diodes connected between the control terminal of the driving transistor and the inductive load. The Zeners constitute the reference for the voltage in this case, the maximum voltage being a combination of the Zener voltages.

Shown diagramatically in FIG. 1 is one such circuit. In this example, the inductive load L is connected in a low-side driver configuration, it having one terminal connected to the supply line Vs and the other terminal to the drain terminal D of a MOS driving transistor, here an N-channel type denoted by TM. The transistor TM has its source terminal connected to ground. Connected to the gate G, forming the control terminal of TM, is a driver circuit schematically illustrated by the block C. Connected in series between the gate G and the node D, are a number, n, of Zener diodes schematically indicated at nZ in the Figure. The Zeners are configured to set the maximum voltage at the node D to a value Vmax=nVz+VGS, where Vz is the Zener voltages and VGS is the drop in potential across the gate and the source of the transistor TM. As, upon the transistor TM being turned off, the voltage at the node D attains the value Vmax, the transistor TM will go into conduction, thereby allowing the current to be recycled and discharging the inductor L.

A drawback of this circuit is that the maximum voltage value on the inductor, as determined by the combination of a discrete number of Zener voltages, may not equal exactly the desired one. In the instance of an integrated circuit, it should not be overlooked, moreover, that if the maximum voltage value is fairly high, then the number of the Zeners and the area occupied by the recycling regulating circuit is greater than negligible. The voltage value of the Zener diodes also is liable, as is well recognized, to be indeterminate due to significant process spread.

Another prior circuit solution, which represents a substantial improvement on the first, is shown in FIG. 2. This provides one or more additional transistors in the recycling circuit.

In FIG. 2, corresponding elements are denoted by the same references as in FIG. 1. The recycling regulating circuit further comprises at least one transistor Q of the bipolar type, connected between the gate G and the node D. The Zener diodes nZ are here connected between the base and the collector of the transistor Q. The maximum voltage at the node D is set to the value Vmax=nVz+VBE+VGS, where VBE is the drop in potential between the base and the emitter of the transistor Q. Thus, the maximum clamping voltage will be the resultant of a combination of a larger number of voltage drops than in the circuit previously described. The transistor Q functions to absorb possible excess currents and prevent the Zener from being burned. The resistor R, depicted in series with the Zener diodes in FIG. 2, is also effective to limit the current.

Neither of the circuits just described has good stability. In fact, since the voltages across the Zeners have different dependence on temperature, temperature compensation can only be achieved for certain definite maximum voltage values.

For the purpose, the prior art provides still more sophisticated and precise solutions. For example, one conventional circuit design provides for the use of a recycling regulating circuit which includes a voltage divider and a comparator. A circuit of that kind is disclosed in European Patent Application EP-0622717.

Such a circuit is illustrated in schematic form by FIG. 3. The voltage divider R1–R2 is connected between the inductive load L and a ground terminal. The comparator COMP has two inputs respectively connected to the output of the voltage divider and to a generator of a reference voltage Vref, and has an output coupled to the gate terminal G of the driving transistor TM. In the example of FIG. 3, the circuit further comprises a current mirror M having an input leg connected to the output of the comparator COMP and an output leg connected to the gate terminal G. The mirror M is also supplied to the node D.

Basically therein, the reference voltage is compared with a divided value of the voltage to be regulated which is present on the node D. Current recycling takes place upon the voltage value Vmax=Vref(R1+R2)/R2 being reached on the node D. The reference for the voltage comprises that voltage reference circuit and the divider. Since the variation in the maximum voltage depends on a voltage reference which can be easily selected to be a stable one temperature-wise, that recycling regulating circuit is quite stable temperature-wise.

The systems to be specifically discussed in connection with the invention include, as previously mentioned, a plurality of inductors. For example, in the instance of plural automotive devices wherein the different inductive loads require driving on an individual basis and must be operated each independently of the others, the recycling of the discharge current from each load should take place at different times from the other loads, and the discharging time required may not be the same for all the loads.

It will be appreciated that the principles of this invention can also be applied to devices of a different kind, e.g. those used in industrial systems employing multiple stepper motors.

To provide independent recycling for different inductive loads, it has been common practice to recycle current through a plurality of recycling regulating circuits, each connected to a respective one of the loads. The overvoltage clamping is done with a separate reference for each load.

The reference for the voltage may be provided in any desired way. In general, circuits incorporating Zeners like those shown in FIGS. 1 and 2 are used. However, the combination of a number of such circuits, of the types previously described, has some disadvantages. The overall number of Zeners employed actually tends to be fairly large. To ensure restoration of a plurality of driving transistors to the on state in an independent manner, it is necessary that a separate series of Zeners be connected to each transistor, so as to directly limit the voltage to the respective node D for connection to the load and leave the operation of the other transistors unaffected. However, the number of the Zeners may be of about ten in each series, at the aforementioned maximum voltage values, which means that a very large area of the integrated circuit will be occupied.

Even where recycling circuits of the type shown in FIG. 3 are used, in order to ensure independence of recycling for the various loads, because it would be disadvantageous to uncouple the renewed turning on of the driving transistors, and hence the recycling, in any other ways, a corresponding number of dividers and comparators must be provided, which again poses problems of area occupation.

A technical problem that underlies this invention is to provide a circuit for independently recycling a plurality of inductive loads connected between two power supply terminals, which circuit can be integrated monolithically within a small integration area.

An object of this invention is to provide a recycling circuit which is stable to variations in ambient conditions, such as temperature, and to varying parameters during its manufacture.

SUMMARY OF THE INVENTION

A circuit according to an embodiment of the invention includes, for each of a plurality of independent loads: an active element connected in series with the respective inductive load and having a control terminal to which a driver circuit is connected; and a regulator means for controlling the recycle of the discharge current from the respective load, connected to the control terminal of the active element and to a node for connection between the active element and the respective inductive load.

An idea on which the invention stands is that of providing a recycling circuit for plural inductive loads, which comprises, for each inductive load, at least one circuit element which allows the turning on of the driving element of one load to be uncoupled from that of the others. In this way, independent recycling of each load can be ensured while using a single common reference.

A monolithically integrated circuit for controllably and independently recycling the discharge current of a plurality of inductive loads connected between first and second power supply terminals comprises, for each of the loads, an active element and a regulator means for controlling the recycling of the discharge current of a respective one of the loads. The active element is connected in series with the inductive load between the two supply terminals, and has a control terminal to which a driver circuit is connected and which is coupled through an impedance to the supply terminal of lower potential. The regulator means is connected to the control terminal of the active element and to a node for connection between the active element and the respective inductive load.

According to an embodiment of the invention, the recycling circuit includes a single voltage reference Vref.

In accordance with an embodiment of this invention, the regulator means for recycling control includes a blocking and triggering element and a circuit means for generating a turn-on signal to be applied to the control terminal of the active element. The blocking and triggering element is connected to the voltage reference, which is common for the whole circuit, and is coupled to the node for connection to the load. This circuit means is connected to the control terminal and operatively connected to the blocking and triggering element. Preferably, it may also be connected to the node for connection. The blocking and triggering element will act on the circuit means to generate the turn-on signal and only start the recycling of the current through the active element when the potential at the node for connection to the load is significantly higher in absolute value than the reference potential. Otherwise, the blocking and triggering element would block the flow of current through said circuit means.

The blocking and triggering element permits the control terminal of the active elements for the different inductive loads to be uncoupled by acting thereon as a sensor of the voltage value present on the node for connection and as a recycling activator.

Particularly, in an embodiment of the invention, the circuit means for generating the turn-on signal comprises a current mirror. Also, the blocking and triggering element may be a diode which will be forward biased when the potential at the terminal for connection to the respective load is significantly higher in absolute value than the reference potential.

Based on the above solvent idea, the technical problem is solved by an integrated circuit for recycling a plurality of inductive loads, of the type described hereinabove.

The features and advantages of a recycling circuit according to the invention will be apparent from the detailed description of an embodiment thereof, given by way of example and not of limitation with reference to the accompanying drawings.

DETAILED DESCRIPTION

Figure 1:
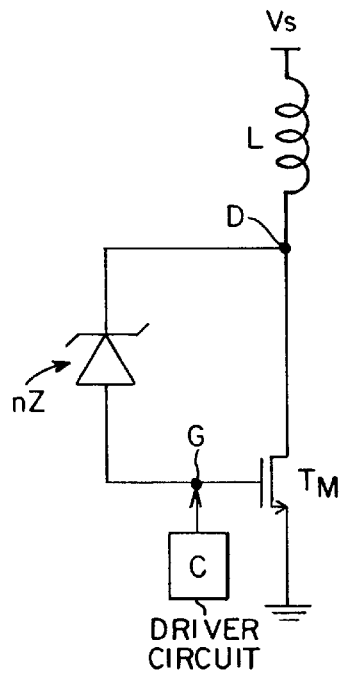
FIG. 1 shows in diagram form a prior art recycling circuit for a single inductive load, whose operation has been described in the foregoing.
Figure 2:
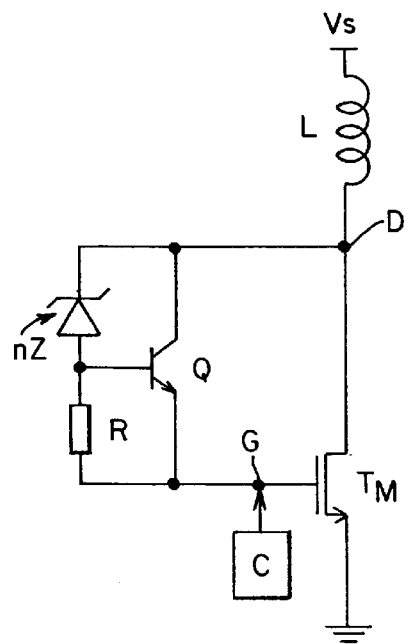
FIG. 2 illustrates a prior art improvement on the circuit shown in FIG. 1.
Figure 3:
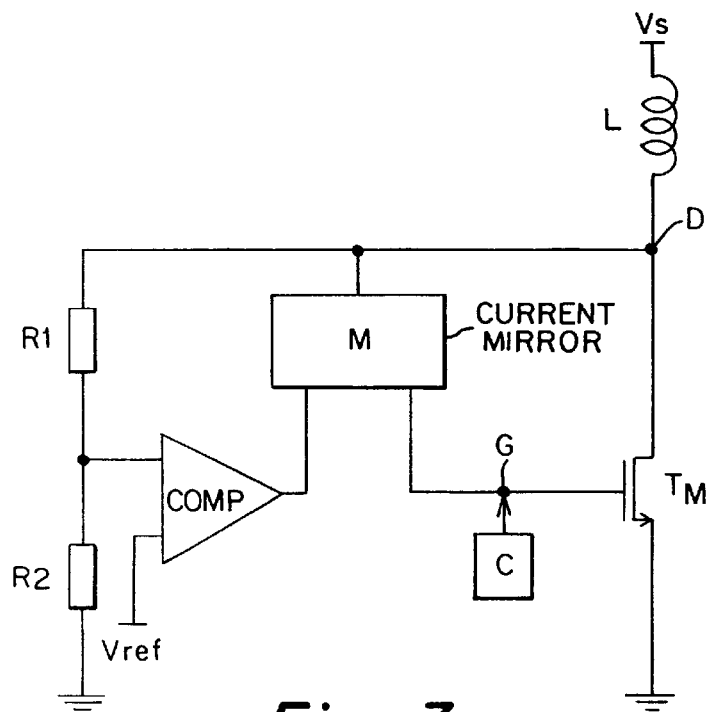
FIG. 3 illustrates a prior art recycling circuit which is uniquely temperature stable and has been discussed in the foregoing.
Figure 4:
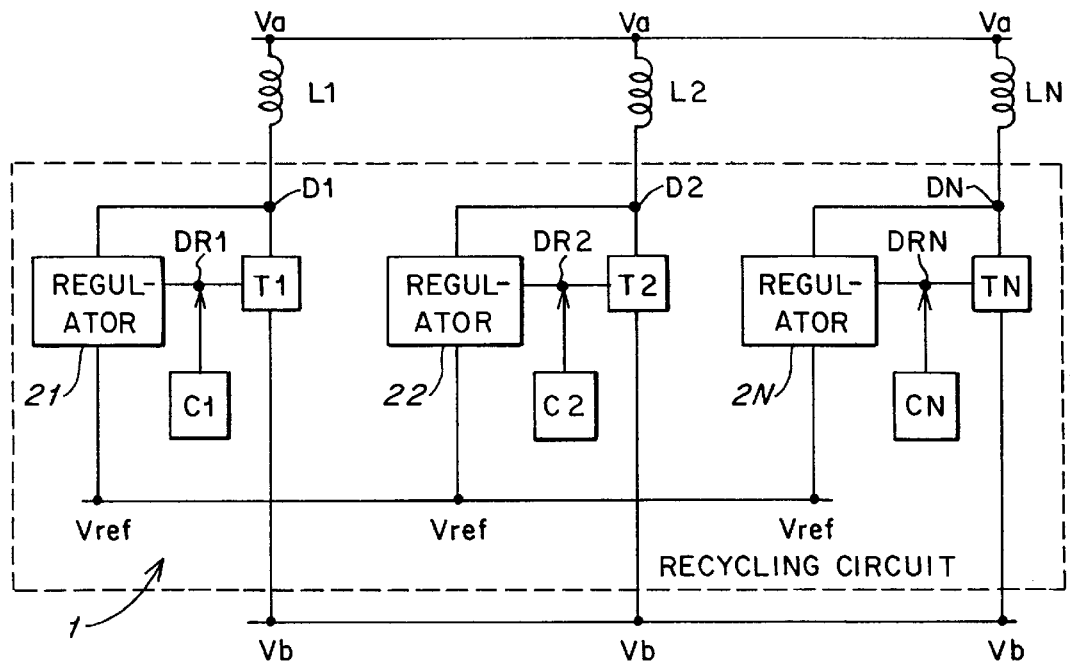
FIG. 4 is a comprehensive diagram of a system which incorporates a circuit for independently recycling a plurality of inductive loads, in accordance with an embodiment of this invention.

FIG. 4 is a block diagram of a device which includes a circuit for controllably and independently recycling the discharge current of a plurality of inductive loads embodying this invention. The figure shows a number, N, of inductive loads L1, L2, ..., LN connected between first and second power supply terminals which are respectively kept at constant voltages Va and Vb. The number N of inductive loads may be on the order of a few tens.

The lines Va and Vb typically represent power supply and ground lines. Both the low-side configuration, with Va corresponding to the supply voltage, and the high-side configuration, with the supply line being denoted by Vb, are encompassed by this invention.

Connected to the N inductive loads is a driver and recycling circuit according to an embodiment of the invention, as generally shown at 1. The circuit is preferably an integrated circuit and has a number, N, of terminals D1, D2, ..., DN for connection to the inductive loads.

Circuit 1 comprises, for each the inductive load, an active element Tn, where n=1, ..., N, which is connected in series with the respective inductive load between the two supply terminals. Specifically, and as shown in FIG. 4, the active element Tn is connected to the respective node Dn and the supply terminal Vb. A regulator means, schematically represented by the block 2n, for controlling the recycling of the discharge current of the inductive load Ln, is connected to the node Dn and the control terminal DRn of the active element Tn. The regulator means 2n is further connected to a reference circuit, to be also indicated as the potential reference hereinafter, which generates a reference voltage Vref within the circuit 1.

In accordance with an embodiment of this invention, and as shown in FIG. 4, there may be a single potential reference which is common for the whole circuit. Such a reference may determine the maximum voltage value for triggering the recycling of the inductive loads.

The inductive load Ln driving takes place directly through the active element Tn, functioning as a switch to regulate the flow of current through the respective load Ln. A driver circuit Cn is operatively connected to a control terminal DRn of the active element Tn to alternatively drive it on and off. The driver circuits Cn operate independently to permit operation of the N inductive loads. In practice, each circuit Cn acts on its corresponding active element and the latter, once turned on, forces a current flow through the inductor Ln.

Upon the driver circuit Cn cutting off the flow of current through the inductive load Ln, and the current must then be flowed back as described, the regulator means 2n will allow the current to be recycled from the inductive load Ln through Tn. Specifically, the regulator means 2n functions as a sensor of the voltage value present on the specific node Dn for connection and determines the way that the corresponding active element Tn is to be turned back on, based upon a comparison with the value of the reference voltage Vref.

Figure 5:
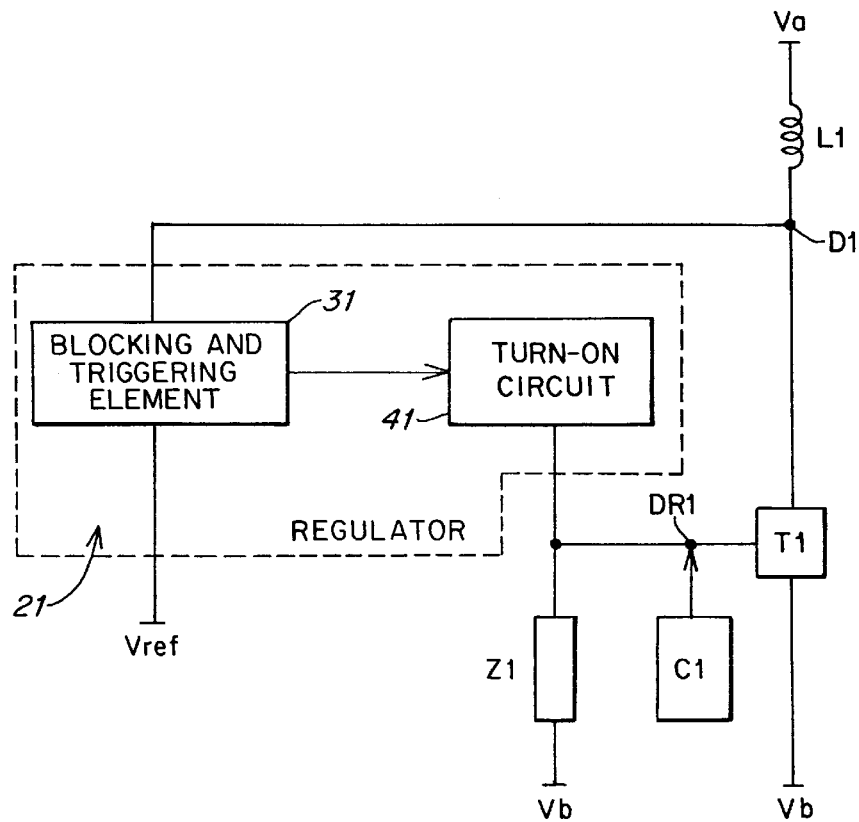
FIG. 5 is a functional block diagram of a portion of the circuit in FIG. 4 related to a first inductive load.

A more detailed scheme of operation for a portion of the recycling circuit relating to a single inductive load is shown in FIG. 5. The same references are used in this figure as in FIG. 4 to denote similar blocks and elements.

FIG. 5 shows the inductive load L1, by way of example, but the scheme applies equally well to each of the other loads.

As shown in FIG. 5, the regulator means 21 comprises, in accordance with this invention, a blocking and triggering element 31 which is connected to the potential reference Vref and coupled to the node D1 for connection between the active element T1 and the inductive load L1. A circuit means 41 connected to the control terminal DR1 is arranged to generate a turn-on signal for application to the control terminal DR1. The control terminal DR1 is operatively acted upon by the blocking and triggering element 31. Preferably, though not necessarily, this circuit means 41 is powered via the node D1 for connection.

In practice, the circuit of FIG. 5 operates as follows. The voltage at the node D1, which would be raised on account of the abrupt interruption in the current flow caused by the active element T1 being turned off, can attain a predetermined value VmaxD1 which is related to the reference value Vref. The element 31 will at that point be acting on the circuit means 41 to cause generation of the above turn-on signal. This signal generated by the circuit means 41 again enables the flow of current through the active element T1, with consequent discharging of the inductive load.

Specifically, the blocking and triggering element 31 performs a comparison of the potential present on the node for connection D1 with the constant value Vref. It is only activated when the potential at the node D1 is significantly higher in absolute value than the reference potential Vref. On the other hand, as long as the potential on the node D1 keeps within acceptable values, i.e. below VmaxD1, the element 31 will function as a blocking element to inhibit operation of the means 41.

The reference for the voltage according to an embodiment of this invention consists basically of the potential reference Vref; that is, the maximum voltage value for recycling triggering is substantially dependent on the value of Vref.

The blocking and triggering element 31 functions to uncouple the control terminal DR1 of the active element T1 from the potential reference Vref. Accordingly, all the control terminals DRn will be uncoupled from one another. This allows a single voltage reference to be provided within the driver circuit 1 of the N inductive loads, while ensuring independent triggering for the different active elements Tn, with the latter being each allowed to recycle whenever necessary.

This means that it can be assumed, for example, that at a time t0, one load, for example Li, will be in a turning on phase, and the voltage at the node Di approximately equal to Vb but for the potential drop across the active element. Another active element Tk will be off, and no current will be flowing through Lk. The flow of current through a further inductive load Lj may be cut off at that time t0, so that an overvoltage will appear on a node Dj. According to the invention, a discharge current would be recycled through the load Lj only.

The potential reference Vref may be included into the circuit, as shown in FIG. 4. This reference may be provided by any generator of a constant voltage. For example, the voltage Vref may be derived from the output of a voltage regulating circuit, or of a band-gap type of voltage multiplier. Also notice that the value of the voltage Vref may be either positive or negative, depending on specific applications.

The control terminal DR1 of the active element T1 may be further coupled to the lower supply voltage terminal Vb through an impedance Z1, as shown in FIG. 5. The latter may represent one or more resistive loads. However, where the transfer speed of the turn-on signal, that is the discharge time of the terminal DR1, is of no concern, Z1 may comprise one or more capacitive loads.

Advantageously according to an embodiment of the invention, the circuit for recycling the N loads makes for a smaller bulk or occupied area than in the conventional circuit designs previously discussed. This because it is unnecessary to provide a number N of references for the voltage, as already explained. However, the blocking and triggering elements 3n and circuit means 4n may be small in size, as explained hereinafter in connection with one embodiment.

The recycling circuit embodying this invention is advantageously stable, in that the maximum voltage value for recycling triggering is mainly dependent on the reference Vref. The potential reference may be selected to be uniquely stable to changes in ambient conditions, in particular to be unaffected by temperature. Thus, the operational conditions for the circuit triggering are made independent of random parameters.

Figure 6:
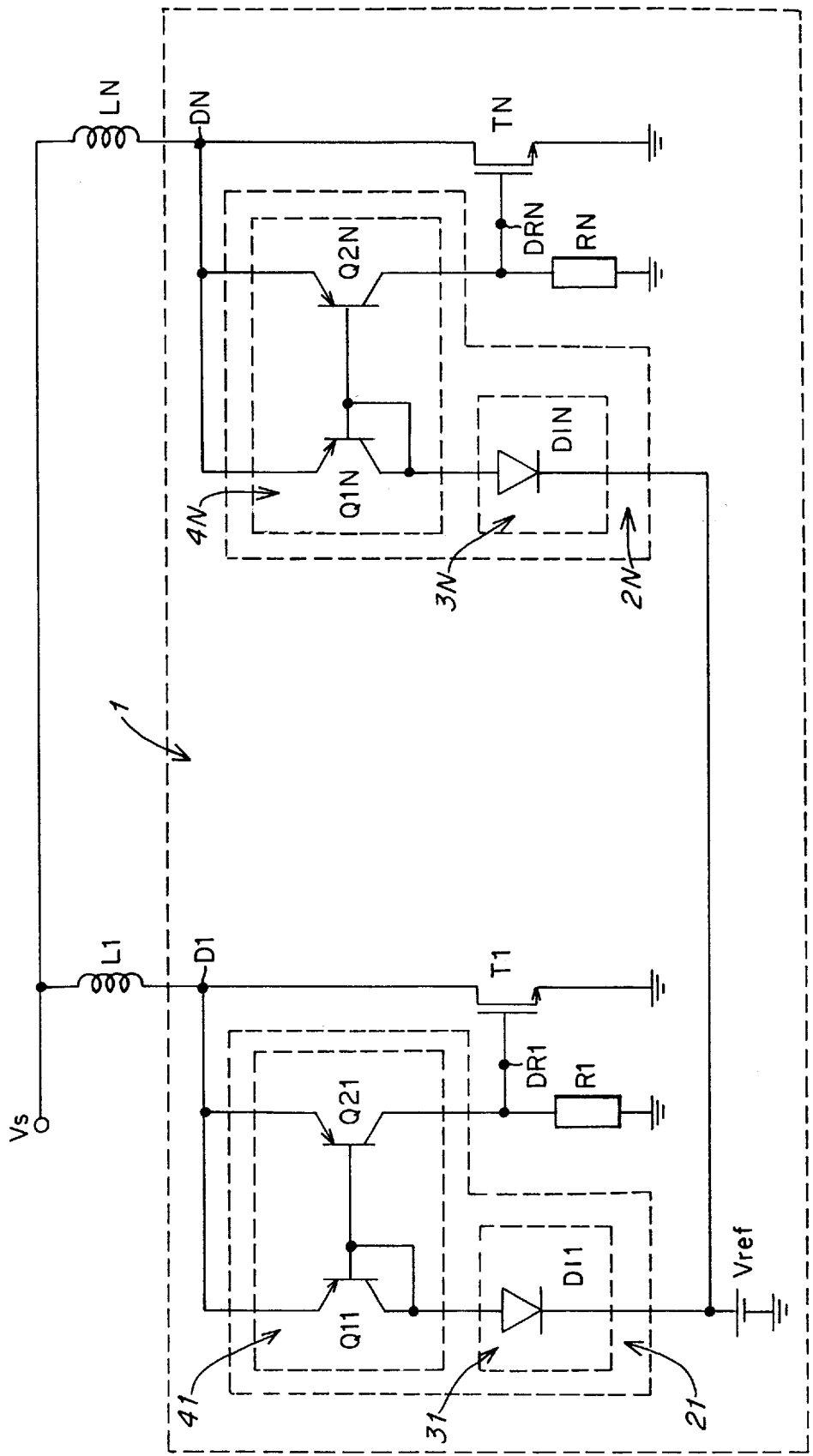
FIG. 6 illustrates an exemplary embodiment of a recycling circuit according to an embodiment of the invention, for application in a low-side driver configuration.

A wiring diagram is specifically depicted in FIG. 6 for a preferred embodiment. In FIG. 6, the blocks shown in the preceding figures have been denoted by the same references for clarity.

The embodiment of FIG. 6 shows the N inductive loads Ln connected in a low-side driver configuration, that is with one terminal connected to a supply line Vs and the other terminal to the espective node Dn for connection between the load Ln and the circuit 1.

A typical number of inductive loads for automotive applications is N=8, for example. For simplicity, the description to follow will refer to a portion of the circuit 1 relating to a single inductive load, the first load L1, for example.

The active element T1 for driving the load L1 comprises an N-channel MOS transistor. Preferably, this would be a power transistor in applications where the inductive load driving current is fairly large. The transistor T1 has a drain terminal connected to the node D1 and a source terminal to ground.

The regulator means 21 for recycling control comprises a diode DI1 having its cathode connected to the potential reference Vref and its anode connected to an input leg of a current mirror, also included in the block 21 and comprising a pair of bipolar transistors Q11 and Q21 both of which are of the pnp type in this embodiment. An output leg of the current mirror Q11–Q21 is connected to the control terminal DR1, specifically comprised of a gate terminal of the transistor T1.

The current mirror as shown in FIG. 6 is preferably powered via the node D1 for connection between the circuit and the load L1.

The gate terminal of the transistor T1 is also coupled to ground through a resistive load R1. The load R1 shown represents schematically one or more resistors in series. A driver circuit, illustrated in FIGS. 4 and 5 by the block C1 and also acting on the gate terminal DR1, is omitted from FIG. 6.

The operation of the circuit in FIG. 6 during the recycling phase will now be described.

When the driving transistor T1 is turned off by the driver circuit, the transistor T1 is again turned on for recycling upon the excess voltage on the node D1 reaching the value VmaxD1, which corresponds to the conducting state of the diode DI1. As can be seen in the Figure, this value is given by the relation VmaxD1=Vref+VDI1+Vbe(Q11), where VDI1 is the voltage drop across the diode DI1 in conduction and Vbe(Q11) is the potential difference between the base and the emitter of the transistor Q11, as connected in a diode configuration. The value of Vmax is approximately equal to the value of Vref with the diode DI1 and current mirror conducting. In this condition, the diode DI1 will actually be conducting because a voltage is present between its anode and cathode terminals which is equal to the forward biasing voltage. A current is caused to flow through the input leg of the current mirror Q11–Q21, from the potential reference through the diode DI1, which is mirrored onto the output leg. Thus, the current mirror supplies current to the resistor R1 and turns on again the transistor T1, biasing its gate DR1.

In a condition of no recycling, such as when the transistor T1 is on and a current is flowing through the load L1, the diode DI1 functions to block the current flow, the drain terminal of the transistor T1, and therefore the node D1, being in this case at a low voltage. The voltage on the anode of the diode DI1 is far lower than the cathode voltage, i.e. than Vref, so that the diode will block the flow of current. Accordingly, the transistors Q11 and Q21 of the current mirror will be in the off state.

Thus, the diode DI1 functions as a blocking and triggering element, and is encircled by a dash line 31 in the Figure. Of course, this element 31 may be implemented in some other ways, provided that it will only supply current when the potential on its anode, or else on the node connected to the current mirror input, is significantly higher in absolute value than that on its cathode, but for the intrinsic voltage drop across the element 31 itself The current mirror Q11–Q21 is generally shown at 41; it constitutes a preferential embodiment of the circuit means for generating the transistor T1 turn-on signal for recycling triggering. The turn-on signal consists in this case of the output current from the current mirror. In addition, the current mirror can optionally supply an amplified current.

If the voltage on the node D1 attains a fairly large value, the current mirror should be capable of operating at a high voltage, since it is connected to that node D1.

The circuit construction of the current mirror Q11–Q21 could be implemented in any other ways. Also, the transistors Q11 and Q21 are not required to be of the bipolar type, and the mirror may be implemented with MOS technology, for example. It is also not necessary that the mirror be powered from just D1.

Additionally, the current mirror is not required for practicing the invention. The use of different circuit means is also encompassed by the invention, provided that they can supply a turn-on signal, typically a current or voltage, to the terminal DR1.

The active element T1 illustratively comprised of a MOS transistor could be replaced by a different active element, e.g. a Darlington.

Advantageously, the preferred embodiment shown in FIG. 6 of the recycling circuit 1, where the latter is advantageously in the integrated form, would occupy a greatly reduced area because it includes a reduced number of transistors, and a smaller area than the conventional circuits previously described.

The recycling control afforded by the circuit shown in FIG. 6 is advantageously unaffected by fluctuations in such external parameters as temperature and fabrication, because the values VmaxDn are mainly dependent on the voltage Vref, as previously explained. The contribution from the diodes DIn and the current mirror toward setting the value VmaxDn is a substantially stable one to temperature and unaffected by process parameters.

It should be understood that changes and modifications may be made unto the recycling circuit herein described and illustrated, within the scope of this invention as defined in the appended claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and not intended to be limiting. The invention is limited only as defined in the following claims and the equivalents thereto.

What is claimed is:

1. A circuit for recycling discharge current of an inductive load, the inductive load having a first terminal coupled to a first power supply terminal and a second terminal, the circuit comprising:
   an active element having a first terminal coupled to the second terminal of the inductive load, a second terminal coupled to a second power supply terminal, and a control terminal that is responsive to a control signal; and
   a regulator including:
      a turn-on circuit having a first terminal coupled to the control terminal of the active element and a second terminal; and
      a blocking and triggering element having a first terminal that receives a reference potential, having a second terminal that provides a turn-on signal to the second terminal of the turn-on circuit when a potential at the second terminal of the inductive load has a magnitude greater than a magnitude of the reference potential, so as to begin recycling of current through the active element and to discharge the inductive load, and having a diode that is forward biased to allow current flow through the diode when a potential at the second terminal of the inductive load has a magnitude that is greater than the magnitude of the reference potential.

2. The circuit of claim 1, wherein the turn-on circuit is powered from the second terminal of the inductive load.

3. The circuit of claim 1, wherein the turn-on circuit includes a current mirror having an input leg coupled to second terminal of the blocking and triggering element and an output leg coupled to the control terminal of the active element.

4. The circuit of claim 3, wherein the second terminal of the blocking and triggering element is coupled to the second terminal of the inductive load through the current mirror.

5. The circuit of claim 3, wherein the current mirror further includes a supply terminal coupled to the second terminal of the inductive load.

6. The circuit of claim 1, further comprising a reference voltage generating circuit having an output that provides the reference potential so that the magnitude of the reference potential is substantially unaffected by temperature.

7. The circuit of claim 1, wherein the active element includes a MOS power transistor.

8. An integrated circuit comprising a plurality of circuits of claim 1, wherein the regulator of each circuit is coupled to a respective one of a plurality of inductive loads, each of the plurality of circuits controllably and independently recycling the discharge current of each of the plurality of inductive loads.

9. The circuit of claim 8, wherein each of the plurality of regulators has an input terminal that receives the reference potential.

10. The circuit of claim 1, further comprising:
a control circuit having an output that provides the control signal to the control terminal of the active element; and
an impedance device having a first terminal coupled to the control terminal of the active element and a second terminal coupled to the second power supply terminal.

11. A method for controlling a discharge of current from an inductive load having a first terminal coupled to a first voltage reference and a second terminal, the method comprising the steps of:
allowing a control current to flow from the second terminal of the inductive load to a second voltage reference when a voltage at the second terminal of the inductive load has a magnitude that is greater than a predetermined magnitude;
controlling a discharge device to recycle the current from the inductive load in response to the control current;
blocking the control current when the voltage at the second terminal of the inductive load has a magnitude that is not greater than the predetermined magnitude; and
wherein:
the step of allowing includes forward biasing a diode; and
the step of blocking includes reverse biasing the diode.

12. The method of claim 11, the method being further for controlling a discharge of current from a second inductive load having a first terminal coupled to the first voltage reference and a second terminal, the method further comprising the steps of:
allowing a second control current to flow from the second terminal of the second inductive load to the second voltage reference when a voltage at the second terminal of the second inductive load has a magnitude that is greater than the predetermined magnitude; and
controlling a discharge device to recycle the current from the second inductive load in response to the second control current.

13. A method for controlling a discharge of current from an inductive load having a first terminal coupled to a first voltage reference and a second terminal, the method comprising the steps of:
allowing a control current to flow from the second terminal of the inductive load to a second voltage reference when a voltage at the second terminal of the inductive load has a magnitude that is greater than a predetermined magnitude;
controlling a discharge device to recycle the current from the inductive load in response to the control current;
blocking the control current when the voltage at the second terminal of the inductive load has a magnitude that is not greater than the predetermined magnitude; and
wherein:
the step of allowing includes forward biasing a diode;
the step of blocking includes reverse biasing the diode; and
the step of controlling includes a step of mirroring the control current to provide an activation signal to activate a transistor, so that the transistor discharges current from the second terminal of the inductive load.

14. A method for controlling a discharge of current from an inductive load having a first terminal coupled to a first voltage reference and a second terminal, the method comprising the steps of:
allowing a control current to flow from the second terminal of the inductive load to a second voltage reference when a voltage at the second terminal of the inductive load has a magnitude that is greater than a predetermined magnitude;
controlling a discharge device to recycle the current from the inductive load in response to the control current; and
wherein the step of controlling includes a step of mirroring the control current to provide an activation signal to activate a transistor, so that the transistor discharges current from the second terminal of the inductive load.

15. A method for controlling a discharge of current from an inductive load having a first terminal coupled to a first voltage reference and a second terminal, the method comprising the steps of:
allowing a control current to flow from the second terminal of the inductive load to a second voltage reference when a voltage at the second terminal of the inductive load has a magnitude that is greater than a predetermined magnitude;
controlling a discharge device to recycle the current from the inductive load in response to the control current; and
wherein the step of allowing includes forward biasing a diode having a terminal coupled to a third voltage reference.

16. The method of claim 15, further comprising a step of maintaining a magnitude of the third voltage reference to be substantially independent of a variation in temperature.

17. An apparatus for controlling a discharge of current from an inductive load having a first terminal coupled to a first voltage reference and a second terminal, the apparatus comprising:
means for allowing a control current to flow from the second terminal of the inductive load to a second voltage reference when a voltage at the second terminal of the inductive load has a magnitude that is greater than a predetermined magnitude;
means for controlling a discharge device to recycle the current from the inductive load in response to the control current; and
wherein the means for allowing includes means for blocking the control current when the voltage at the second terminal of the inductive load has a magnitude that is not greater than the predetermined magnitude and a diode that is forward biased when the voltage at the second terminal of the inductive load has a magnitude that is greater than the predetermined magnitude and that is reversed biased when the voltage at the second terminal of the inductive load has a magnitude that is not greater than the predetermined magnitude.

18. The apparatus of claim 17, the apparatus being further for controlling a discharge of current from a second inductive load having a first terminal coupled to the first voltage reference and a second terminal, the apparatus further comprising:

means for allowing a second control current to flow from the second terminal of the second inductive load to the second voltage reference when a voltage at the second terminal of the second inductive load has a magnitude that is greater than the predetermined magnitude; and means for controlling a discharge device to recycle the current from the second inductive load in response to the second control current.

19. An apparatus for controlling a discharge of current from an inductive load having a first terminal coupled to a first voltage reference and a second terminal, the apparatus comprising:

means for allowing a control current to flow from the second terminal of the inductive load to a second voltage reference when a voltage at the second terminal of the inductive load has a magnitude that is greater than a predetermined magnitude;

means for controlling a discharge device to recycle the current from the inductive load in response to the control current; and wherein:

the means for allowing includes means for blocking the control current when the voltage at the second terminal of the inductive load has a magnitude that is not greater than the predetermined magnitude;

the means for allowing includes a diode that is forward biased when the voltage at the second terminal of the inductive load has a magnitude that is greater than the predetermined magnitude and that is reversed biased when the voltage at the second terminal of the inductive load has a magnitude that is not greater than the predetermined magnitude; and the means for controlling includes means for mirroring the control current to provide an activation signal to activate a transistor, so that the transistor discharges current from the second terminal of the inductive load.

20. An apparatus for controlling a discharge of current from an inductive load having a first terminal coupled to a first voltage reference and a second terminal, the apparatus comprising:

means for allowing a control current to flow from the second terminal of the inductive load to a second voltage reference when a voltage at the second terminal of the inductive load has a magnitude that is greater than a predetermined magnitude;

means for controlling a discharge device to recycle the current from the inductive load in response to the control current; and wherein the means for controlling includes means for mirroring the control current to provide an activation signal to activate a transistor, so that the transistor discharges current from the second terminal of the inductive load.

21. An apparatus for controlling a discharge of current from an inductive load having a first terminal coupled to a first voltage reference and a second terminal, the apparatus comprising:

means for allowing a control current to flow from the second terminal of the inductive load to a second voltage reference when a voltage at the second terminal of the inductive load has a magnitude that is greater than a predetermined magnitude;

means for controlling a discharge device to recycle the current from the inductive load in response to the control current; and wherein the means for allowing includes means for forward biasing a diode having a terminal coupled to a third voltage reference.

22. The apparatus of claim 21, further comprising means for maintaining a magnitude of the third voltage reference to be substantially independent of a variation in temperature.

23. A circuit for recycling current from an inductive load through a control device that is coupled in series with the inductive load, the apparatus comprising:

a control circuit having a first terminal coupled to a control terminal of the control device and a second terminal;

a nonlinear device having a first terminal that receives a signal of a predetermined magnitude and a second terminal that provides an activation signal to the second terminal of the control circuit when a voltage at a first terminal of the inductive load has a magnitude that is greater than the predetermined magnitude, so that the control circuit controls the control device to recycle the current from the inductive load; and wherein the nonlinear device includes a diode that is forward biased when the voltage at the first terminal of the inductive load has a magnitude that is greater than the predetermined magnitude and that is reverse biased when the voltage at the first terminal of the inductive load has a magnitude that is not greater than the predetermined magnitude.

24. The circuit of claim 23, wherein the control circuit includes a current mirror having an input leg coupled to the second terminal of the nonlinear device and an output leg coupled to a control terminal of the control device.

25. The circuit of claim 24, wherein:

the inductive load has a second terminal coupled to a first voltage reference;

the control device has a first terminal coupled to the first terminal of the inductive load and a second terminal coupled to a second voltage reference; and the current mirror further has a power terminal coupled to the first terminal of the inductive load.

26. The circuit of claim 23, wherein the predetermined magnitude is a voltage of an input signal.

27. The circuit of claim 26, further comprising a voltage circuit that maintains the predetermined magnitude of the input signal to be substantially independent of a variation in temperature.

28. The circuit of claim 23, in combination with the inductive load and the control device.

29. The circuit of claim 23, the circuit being further for recycling current from a second inductive load through a second control device that is coupled in series with the second inductive load, the circuit further comprising:

a second control circuit having a first terminal coupled to a control terminal of the second control device and a second terminal; and a second nonlinear device having a first terminal that receives the signal of predetermined magnitude and a second terminal that provides an activation signal to the second terminal of the second control circuit when a voltage at a first terminal of the second inductive load has a magnitude that is greater than a predetermined magnitude, so that the second control circuit controls the second control device to recycle the current from the second inductive load.

* * * * *